(12) United States Patent
Joo et al.

(10) Patent No.: US 9,396,935 B1
(45) Date of Patent: Jul. 19, 2016

(54) METHOD OF FABRICATING ULTRA-THIN INORGANIC SEMICONDUCTOR FILM AND METHOD OF FABRICATING THREE-DIMENSIONAL SEMICONDUCTOR DEVICE USING THE SAME

(71) Applicant: SAMSUNG ELECTRONICS CO., LTD., Suwon-si (KR)

(72) Inventors: Won-Jae Joo, Seongnam-si (KR); Sungwoo Hwang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/925,284

(22) Filed: Oct. 28, 2015

(30) Foreign Application Priority Data

May 19, 2015 (KR) .................. 10-2015-0069367

(51) Int. Cl.
| | |
|---|---|
| *H01L 21/02* | (2006.01) |
| *H01L 27/06* | (2006.01) |
| *H01L 27/12* | (2006.01) |
| *H01L 23/538* | (2006.01) |
| *H01L 21/311* | (2006.01) |

(Continued)

(52) U.S. Cl.
CPC ...... *H01L 21/02532* (2013.01); *H01L 21/0245* (2013.01); *H01L 21/0262* (2013.01); *H01L 21/02381* (2013.01); *H01L 21/02444* (2013.01); *H01L 21/02513* (2013.01); *H01L 21/02592* (2013.01); *H01L 21/02667* (2013.01); *H01L 21/02694* (2013.01); *H01L 21/31122* (2013.01); *H01L 23/5387* (2013.01); *H01L 27/0688* (2013.01); *H01L 27/1203* (2013.01); *H01L 29/1606* (2013.01); *H01L 29/78684* (2013.01)

(58) Field of Classification Search
CPC .............. H01L 21/02532; H01L 21/02592; H01L 21/0245; H01L 21/02381; H01L 29/1606; H01L 29/78684
See application file for complete search history.

(56) References Cited

U.S. PATENT DOCUMENTS

| | | | |
|---|---|---|---|
| 8,035,584 B2 | 10/2011 | Jung | |
| 8,493,514 B2 | 7/2013 | Choi et al. | |
| 8,679,976 B2 * | 3/2014 | Lee ..................... | C23C 16/0272 257/29 |

(Continued)

FOREIGN PATENT DOCUMENTS

| | | |
|---|---|---|
| KR | 10-2013-0089611 A | 8/2013 |
| KR | 10-2014-0085113 A | 7/2014 |

OTHER PUBLICATIONS

Shuang Wang et al; "Large-Area Free-Standing Ultrathin Single-Crystal Silicon as Processable Materials"; Nano Letters; 2013; vol. 13; pp. 4393-4398.

(Continued)

*Primary Examiner* — Alonzo Chambliss
(74) *Attorney, Agent, or Firm* — Sughrue Mion, PLLC (57) ABSTRACT

Provided are methods of manufacturing an ultra-thin inorganic semiconductor film and methods of manufacturing three-dimensional (3D) semiconductor device using the ultra-thin inorganic semiconductor film. A method of manufacturing the ultra-thin inorganic semiconductor film includes preparing a Ge substrate, forming an amorphous graphene layer on the Ge substrate, forming an ultra-thin inorganic semiconductor film on the amorphous graphene layer, and transferring the ultra-thin inorganic semiconductor film to a target substrate. The ultra-thin inorganic semiconductor film is a Si thin film or a Ge thin film and may have a thickness of 50 μm or less.

21 Claims, 6 Drawing Sheets

(51) Int. Cl.
*H01L 29/16* (2006.01)
*H01L 29/786* (2006.01)

(56) References Cited

U.S. PATENT DOCUMENTS

| | | | | |
|---|---|---|---|---|
| 9,035,282 | B2* | 5/2015 | Dimitrakopoulos | H01L 29/1606 257/29 |
| 2010/0214434 | A1 | 8/2010 | Kim et al. | |
| 2011/0244662 | A1* | 10/2011 | Lee | C23C 16/0272 438/478 |
| 2012/0003438 | A1* | 1/2012 | Appleton | H01L 29/16 428/195.1 |
| 2012/0256167 | A1* | 10/2012 | Heo | H01L 29/1606 257/27 |
| 2014/0061590 | A1* | 3/2014 | Lee | H01L 29/1606 257/29 |
| 2016/0049475 | A1* | 2/2016 | Bol | H01L 29/1606 257/29 |

OTHER PUBLICATIONS

Kan Zhang et al; "Fast flexible electronics using transferrable silicon nanomembranes"; Journal of Physics D: Applied Physics; vol. 45; 2012; pp. 1-14; 15 pgs. total.

Luca Maiolo et al; "Flexible sensing systems based on polysilicon thin film transistors technology"; Sensors and Actuators B: Chemical; vol. 179; 2013; pp. 114-124; 11 pgs. total.

S. Mack et al; "Mechanically flexible thin-film transistors that use ultrathin ribbons of silicon derived from bulk wafers"; Applied Physics Letters; vol. 88; 2006; pp. 213101-1-213101-3; 3 pgs. total.

Jin Zhao et al; "Synthesis of Large-Scale Undoped and Nitrogen-Doped Amorphous Graphene on MgO Substrate by Chemical Vapor Deposition"; Electronic Supplementary Material (ESI) for Journal of Materials Chemistry; 2012; pp. 1-5.

Jae-Hyun Lee et al; "Wafer-Scale Growth of Single-Crystal Monolayer Graphene on Reusable Hydrogen-Terminated Germanium"; Sciencexpress Reports; Apr. 3, 2014; pp. 1-6.

\* cited by examiner

METHOD OF FABRICATING ULTRA-THIN INORGANIC SEMICONDUCTOR FILM AND METHOD OF FABRICATING THREE-DIMENSIONAL SEMICONDUCTOR DEVICE USING THE SAME

CROSS-REFERENCE TO RELATED APPLICATION

This application claims priority from Korean Patent Application No. 10-2015-0069367, filed on May 19, 2015 in the Korean Intellectual Property Office, the disclosure of which is incorporated herein in its entirety by reference.

BACKGROUND

1. Field

Apparatuses and methods consistent with exemplary embodiments relate to fabricating an ultra-thin inorganic semiconductor film and fabricating a three-dimensional (3D) semiconductor device by using an amorphous graphene layer.

2. Description of the Related Art

Electronic devices based on silicon have been continuously developed as the degree of integration of the devices has increased. Recently, lateral shrinkage of such devices beyond 10 nanometers is reaching a physical limit. Accordingly, the degree of integration has been further increased by using a three-dimensional (3D) chip. However, there is a need for an ultra-thin inorganic semiconductor film that is of high quality and that can be inexpensively produced to fabricate a 3D chip.

In flexible device fields, the 3D chip has been preferentially developed based on organic semiconductor materials. However, the 3D chip formed by using the organic semiconductor materials has low charge mobility and is susceptible to environmental conditions such as heat, oxygen and moisture. Accordingly, attempts have been made to apply inorganic semiconductors, such as, silicon having high electrical/optical/physical characteristics, to the flexible devices.

In order to form an ultra-thin silicon film, a silicon-on-insulator (SOI) wafer is generally used. However, the SOI wafer is expensive. Thus, there is a method of manufacturing the ultra-thin silicon film by etching a lower surface of the silicon wafer by using a KOH solution. However, by using this method, it is difficult to obtain an ultra-thin silicon film having a uniform thickness.

SUMMARY

Provided are methods of manufacturing an ultra-thin inorganic semiconductor film and methods of manufacturing a three-dimensional (3D) semiconductor device by using the method.

Additional aspects will be set forth in part in the description which follows and, in part, will be apparent from the description, or may be learned by practice of the presented exemplary embodiments.

According to an aspect of an exemplary embodiment, there is provided a method of manufacturing an ultra-thin inorganic semiconductor film, the method including preparing a germanium (Ge) substrate, forming an amorphous graphene layer on the Ge substrate, forming an ultra-thin inorganic semiconductor film on the amorphous graphene layer, and transferring the ultra-thin inorganic semiconductor film to a target substrate.

The preparing of the Ge substrate may include forming the Ge substrate on a first substrate, the first substrate being formed of Si, Ge, SiGe, GaAs, quartz, or alumina.

The preparing of the Ge substrate may include epitaxially growing a Ge layer to a thickness in a range from about 50 nm to about 1 µm on the first substrate formed of at least one from among Si, SiGe and alloy $Si_xGe_{1-x}$.

The amorphous graphene layer may include a single layer of graphene.

The forming of the amorphous graphene layer may include applying a carbon containing gas with hydrogen gas at which a volume ratio of the hydrogen gas is in a range from about 5 times to about 20 times of the carbon containing gas under a process pressure maintained in a range from about 1 Torr to about 10 Torr.

The forming of the amorphous graphene layer may include maintaining a process temperature in a range from about 900° C. to about 930° C.

The forming of the amorphous graphene layer may further include forming a passivation layer on a surface of the Ge substrate by applying hydrogen gas onto the Ge substrate.

The ultra-thin inorganic semiconductor film may be a Si thin film or a Ge thin film having a thickness of 50 µm or less.

The forming of the ultra-thin inorganic semiconductor film may include applying a source gas for the ultra-thin inorganic semiconductor film and hydrogen gas.

The method may further include forming a polycrystalline ultra-thin inorganic semiconductor film by annealing the ultra-thin inorganic semiconductor film.

The method may further include forming an insulating layer on the Ge substrate prior to the forming of the amorphous graphene layer, and the forming of the amorphous graphene layer may include forming the amorphous graphene layer on the insulating layer.

The transferring of the ultra-thin inorganic semiconductor film may include transferring the ultra-thin inorganic semiconductor film on the target substrate by using the supporting member after attaching a supporting member onto the ultra-thin inorganic semiconductor film or by using a vacuum produced by a vacuum pump.

The method may further include removing the amorphous graphene layer by oxygen plasma processing prior to the transferring of the ultra-thin inorganic semiconductor film onto the target substrate.

The forming of the ultra-thin inorganic semiconductor film may include forming at least one semiconductor device on the amorphous graphene layer by using the ultra-thin inorganic semiconductor film, and the transferring of the ultra-thin inorganic semiconductor film onto the target substrate comprises transferring the at least one semiconductor device.

The target substrate may be a flexible substrate.

According to an aspect of another exemplary embodiment, there is provided a method of manufacturing a three-dimensional (3D) semiconductor device, the method including preparing a Ge substrate, forming an amorphous graphene layer on the Ge substrate, forming an ultra-thin inorganic semiconductor film on the amorphous graphene layer, forming a plurality of first semiconductor devices by using the ultra-thin inorganic semiconductor film, transferring the first semiconductor devices to a target substrate, forming a plurality of second semiconductor devices by repeating the preparing of the Ge substrate, the forming of the amorphous graphene layer, the forming of the ultra-thin inorganic semiconductor film, and using the ultra-thin inorganic semiconductor film; transferring the plurality of second semiconductor devices onto the plurality of first semiconductor devices, wherein the forming of the second semiconductor devices and the transferring of the second semiconductor devices are repeated at least once or more.

According to an aspect of another exemplary embodiment, a method of manufacturing a three-dimensional (3D) semiconductor device is provided. The method includes: preparing a Ge substrate; forming an amorphous graphene layer on the Ge substrate; forming an ultra-thin inorganic semiconductor film on the amorphous graphene layer; forming a plurality of first semiconductor devices by using the ultra-thin inorganic semiconductor film; and transferring the plurality of the first semiconductor devices to a target substrate.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION

Reference will now be made in detail to exemplary embodiments, examples of which are illustrated in the accompanying drawings. In the drawings, the thicknesses of layers and regions are exaggerated for clarity. The exemplary embodiments are capable of various modifications and may be embodied in many different forms.

It will be understood that when an element or layer is referred to as being "on" another element or layer, the element or layer may be directly on another element or layer or intervening elements or layers.

FIGS. 1A through 1E are cross-sectional views illustrating a method of manufacturing an ultra-thin inorganic semiconductor film according to an exemplary embodiment.

Figure 1A:
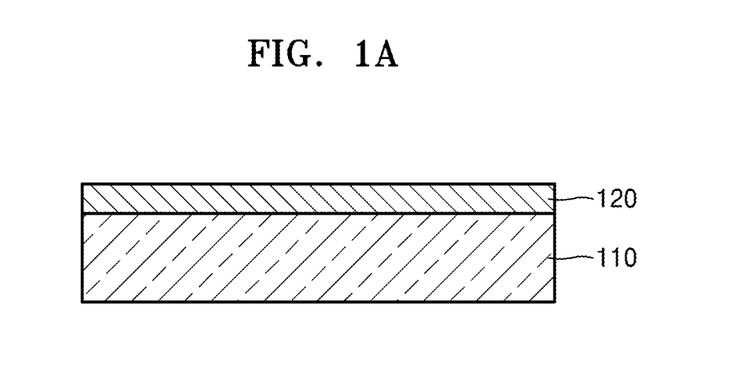
FIGS. 1A through 1E are cross-sectional views illustrating a method of manufacturing an ultra-thin inorganic semiconductor film according to an exemplary embodiment.

Referring to FIG. 1A, a Ge layer 120 is formed on a first substrate 110. In order to form the Ge layer 120, a Ge source, for example, a GeH$_4$ gas is supplied into a reaction chamber (not shown) where the first substrate 110 is placed.

The first substrate 110 may be formed of Si, Ge, SiGe, GaAs, quartz, or alumina. When the first substrate 110 is formed of mono-crystalline, the Ge layer 120 may be epitaxially grown on the first substrate 110. For example, when the first substrate 110 is formed of Si mono-crystalline, the Ge layer 120 is formed to a thickness in a range from about 50 nm to about 1 µm. When the Ge layer 120 has a thickness of 50 nm or less, it is difficult to grow a graphene layer thereon. It takes a long time to grow the Ge layer 120 having a thickness greater than 1 µm. When a Ge substrate is used as the first substrate 110, the formation of the Ge layer 120 may be omitted.

The first substrate 110 is not limited to a mono-crystalline substrate. When the Ge layer 120 is grown on the first substrate 110 formed of an amorphous or poly-crystalline material, an amorphous or poly crystalline Ge layer 120 is formed.

Hereinafter, a case in which the first substrate 110 is a mono-crystalline silicon substrate and the Ge layer 120 is an epitaxially grown mono-crystalline layer is described.

Figure 1B:
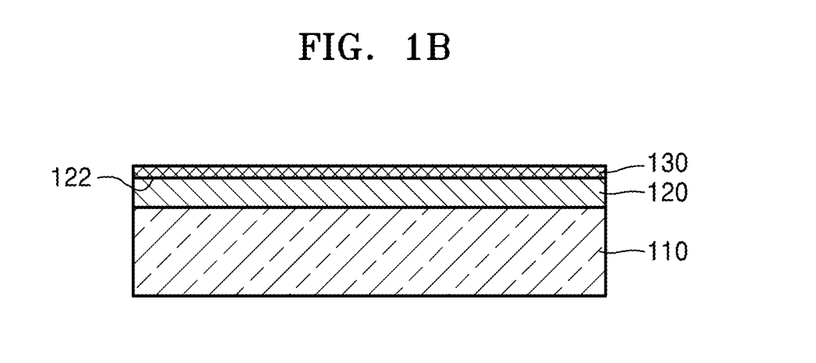

Referring to FIG. 1B, an amorphous graphene layer 130 is formed on the Ge layer 120. The amorphous graphene layer 130 may be a single layer of graphene. In order to form the amorphous graphene layer 130 by using low pressure chemical vapor deposition (LPCVD), a carbon containing gas and a hydrogen containing gas are simultaneously supplied into a reaction chamber at a temperature in a range from about 900° C. to about 930° C. The carbon containing gas may be, for example, $CH_4$, $C_2H_2$, $C_2H_4$, or CO. Hereinafter, the method is described with $CH_4$ as the carbon containing gas.

A process pressure of the reaction chamber to which a $CH_4$ gas and a $H_2$ gas are supplied is in a range from about 1 Torr to about 10 Torr, and a volume ratio of $CH_4$ gas/$H_2$ gas is in a range from about 1/5 to about 1/20. In this process, a hydrogen passivation layer 122 is formed on a surface of the Ge layer 120. The hydrogen passivation layer 122 is formed on the surface of the Ge layer 120 by combining a dangling bond that is present on a surface of the Ge layer 120 and hydrogen. Due to the formation of the hydrogen passivation layer 122, an adhesive force between the Ge layer 120 and the amorphous graphene layer 130 is very low, and thus, the amorphous graphene layer 130 may be easily detached from the Ge layer 120.

Figure 1C:
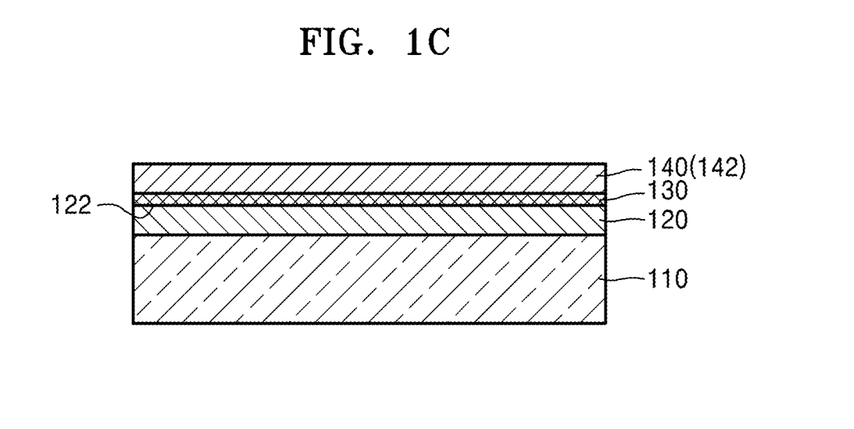

Referring to FIG. 1C, an ultra-thin inorganic semiconductor film 140 is formed on the amorphous graphene layer 130. The ultra-thin inorganic semiconductor film 140 may be formed of silicon or germanium. Hereinafter, a case that the ultra-thin inorganic semiconductor film 140 is an ultra-thin silicon film 140 will be described. The ultra-thin silicon film 140 may have a thickness of approximately 50 µm or less. The ultra-thin silicon film 140 having the thickness of 50 µm or less is flexible. Accordingly, the ultra-thin silicon film 140 may be used for manufacturing a flexible device that includes a wearable device, such as an epidermal device.

In order to form the ultra-thin silicon film 140, a $SiH_4$ gas and a $H_2$ gas are supplied to the reaction chamber at a volume ratio of 1/20 at a process pressure of 10 Torr, and the reaction chamber is maintained at a process temperature in a range from about 500° C. to about 700° C. The grown ultra-thin silicon film 140 may be amorphous silicon. The $SiH_4$ gas may be supplied to the reaction chamber as a mixed gas with the $H_2$ gas at a volume ratio of 5%.

Figure 2:
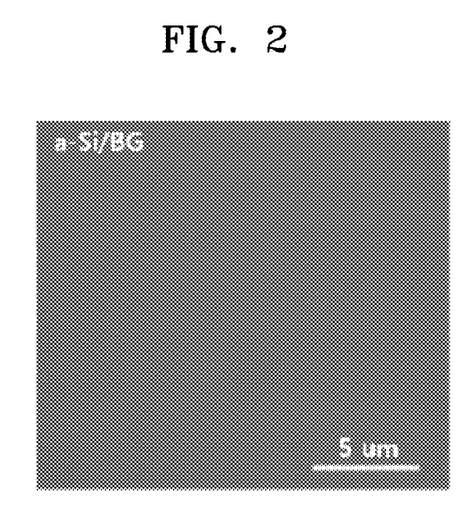
FIG. 2 is a scanning electron microscope (SEM) image of a surface of the ultra-thin inorganic semiconductor film grown on an amorphous graphene layer.

FIG. 2 is a scanning electron microscope (SEM) image of a surface of the ultra-thin silicon film 140 grown on an amorphous graphene layer. Referring to FIG. 2, it is apparent that silicon is uniformly grown on the whole region.

An amorphous graphene layer may be a single layer of graphene in which irregular number of carbons, for example 5 to 7 carbons form a ring unlike a crystalline graphene layer in which 6 carbons form a ring regularly. Since dangling bonds are not present on a surface of the crystalline graphene, it is difficult to form a thin film thereon. In particular, in the case of the crystalline graphene, a surface energy of the whole surface of the crystalline graphene is very low, and thus, it is difficult for the crystalline graphene to absorb other materials and to form seeds for growing a thin film during chemical deposition/growing of an ultra-thin silicon film. However, in the case of the amorphous graphene, although a dangling bond is not present, deviation of surface energy occurs due to the distribution of carbon rings (having a pentagonal shape, hexagonal shape, and heptagonal shape) that are not spatially uniform, and thus, absorption occurs on locations having a relatively high surface energy. This allows seeds to easily form during chemical deposition/growing of the ultra-thin silicon film. The ultra-thin silicon film is grown on a layer composed of the seeds. The ultra-thin silicon film formed on the amorphous graphene layer may have a uniform thickness.

Figure 3:
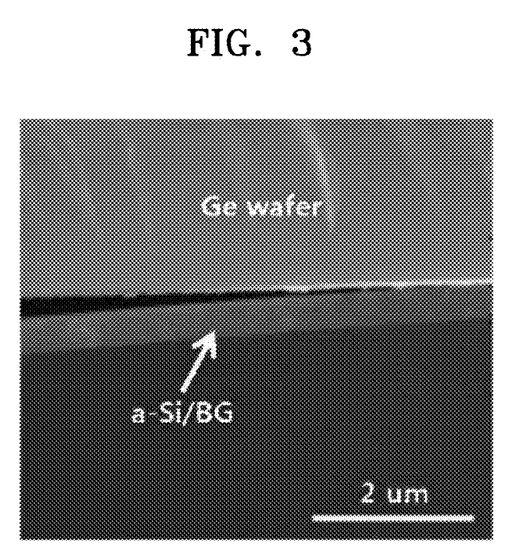
FIG. 3 is an SEM image of a vertical cross-section of silicon grown on an amorphous silicon layer to a height in a range from about 300 nm to about 400 nm.

FIG. 3 is an SEM image of a vertical cross-section of silicon grown on an amorphous silicon layer to a height in a range from about 300 nm to about 400 nm. It is apparent that the silicon is grown with a uniform thickness. When the silicon and the Ge layer are cut for measuring a lateral cross-section, some cracks occur between the amorphous graphene layer and the Ge layer. That is, due to the hydrogen passivation layer formed on an upper surface of the amorphous graphene layer, the amorphous graphene layer is readily separated from the Ge layer.

Figure 4:
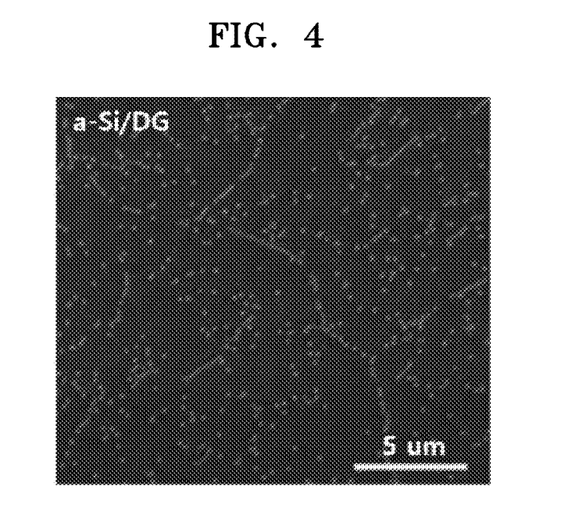
FIG. 4 is an SEM image of silicon grown on an amorphous silicon layer according to a comparative example.

FIG. 4 is an SEM image of silicon grown on a crystalline graphene layer according to a comparative example. In order to form the crystalline graphene layer on a Ge layer, a carbon containing gas and a hydrogen gas are supplied to a reaction chamber in which the Ge layer is placed at a temperature in a range from about 900° C. about 930° C. $CH_4$ gas was used as the carbon containing gas. A process pressure of the reaction chamber to which the carbon containing gas and the hydrogen gas are supplied was maintained in a range from about 70 Torr to about 100 Torr. A volume ratio of $CH_4$ gas/$H_2$ gas was approximately in a range from about 1/50 to about 1/200. As a result of this process, a crystalline graphene layer was formed on the Ge layer.

Referring to FIG. 4, it is apparent that silicon seeds are mainly grown along defects of graphene, for example, grain boundaries of graphene. The silicon seeds are not uniformly formed on the crystalline graphene layer. It is understood that since potentials of a surface of the crystalline graphene are uniform, there are no sites that act as seeds, and thus, the formation of silicon seeds is difficult.

Referring to FIG. 1C, the grown ultra-thin silicon film 140 is annealed. The annealed ultra-thin silicon film 142 may become poly-crystalline silicon. The annealing may be performed at a high temperature of, for example, in a range from about 850° C. to about 900° C. for about 1 to 5 hours after placing the grown ultra-thin silicon film 140 in a high temperature furnace (not shown).

Figure 5:
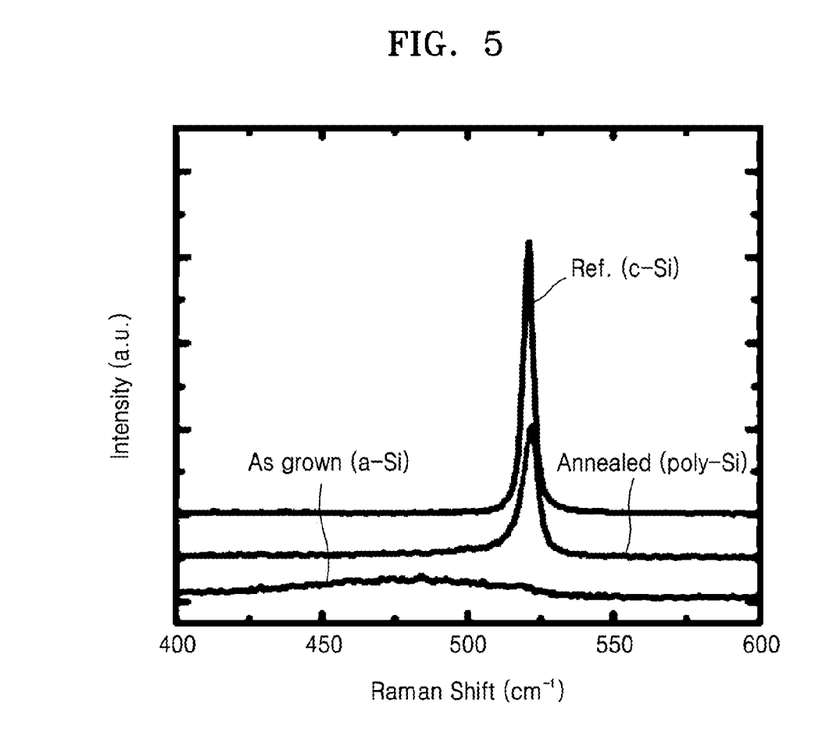
FIG. 5 is a graph showing Raman spectrums of a grown ultra-thin silicon film and an annealed ultra-thin silicon film according to an exemplary embodiment.

FIG. 5 is a graph showing Raman spectrums of an ultra-thin silicon film and an annealed ultra-thin silicon film. For reference, a Raman spectrum of crystalline silicon is also depicted.

Referring to FIG. 5, the grown ultra-thin silicon film a-Si has almost no silicon peak at 520 cm$^{-1}$, and this denotes that the grown ultra-thin silicon film is in an amorphous state. The annealed ultra-thin silicon film poly-Si has a silicon peak, but the strength of the silicon peak is lower than the crystal silicon c-Si, and this denotes that the annealed ultra-thin silicon film is polycrystalline silicon.

Figure 1D:
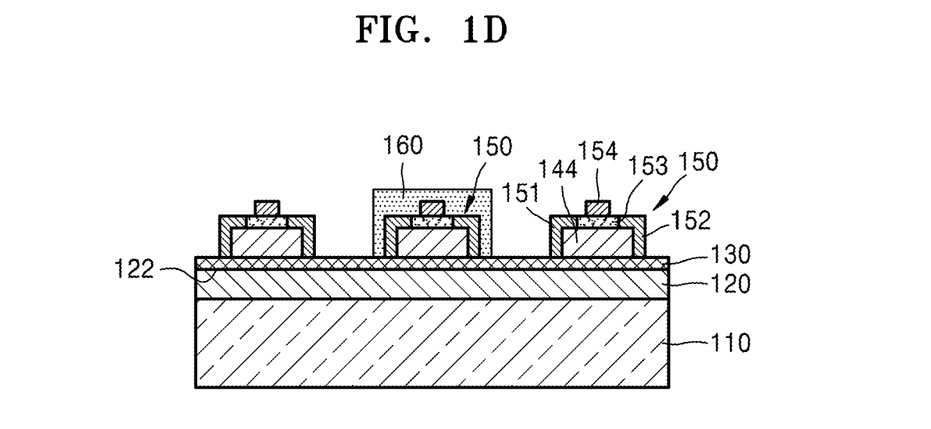

Referring to FIG. 1D, a plurality of semiconductor devices, for example, a plurality of field effect transistors (FETs) 150 may be formed on the amorphous graphene layer 130 by using the annealed ultra-thin silicon film 142. For example, the ultra-thin silicon film 142 may be used as a channel layer 144 of the field effect transistors (FETs) 150 by patterning the ultra-thin silicon film 142. The FET 150 may include a source electrode 151 and a drain electrode 152 that are connected to both sides of the channel layer 142, and a gate insulating layer 153 and a gate electrode 154 sequentially formed on the channel layer 142.

FIG. 1D shows a plurality of FETs 150 formed on the amorphous graphene layer 130. However, it is understood that one or more other exemplary embodiments are not limited thereto. PN diodes, memories, or photo diodes may be formed by using the ultra-thin silicon film 142.

Figure 1E:
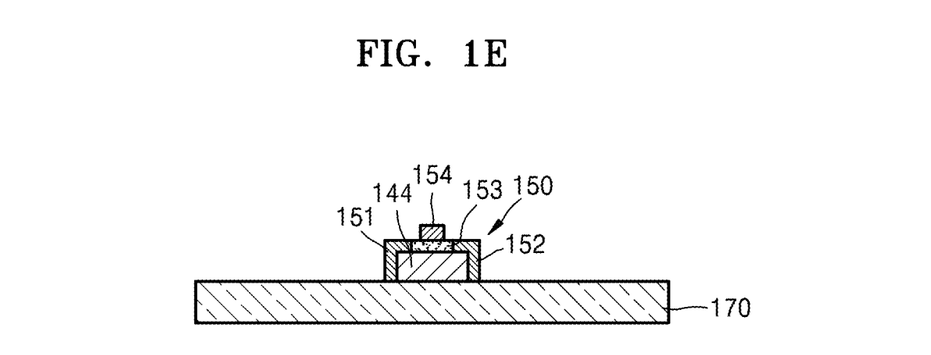

Referring to FIG. 1E, a flexible substrate 170 is prepared in advance. The flexible substrate 170 may be formed of polymer or a thin semiconductor. Next, as depicted in FIG. 1D, a specific FET 150 is picked up by placing a supporting member 160, for example, a thermal release tape, on the specific FET 150. In this process, since a bonding force between the amorphous graphene layer 130 and the Ge layer 120 is low and the amorphous graphene layer 130 is a single layer, the amorphous graphene layer 130 is readily ripped off from the supporting member 160, and thus, the specific FET 150 is adhered to the supporting member 160.

The amorphous graphene layer 130 may be removed by oxygen plasma processing. In the case when the amorphous graphene layer 130 is removed by the oxygen plasma processing, electrical connection between the source electrode 151 and the drain electrode 152 in the specific FET 150 may be prevented. When the specific semiconductor device is a photo diode or a PN diode instead of the FET 150, the amorphous graphene layer 130 under the specific semiconductor device is connected to an electrode (not shown), and the amorphous graphene layer 130 may not be removed.

Next, the specific FET 150 may be transferred onto the flexible substrate 170.

After performing the transfer process, the supporting member 160 is removed. For example, when a thermal release tape is used as the supporting member 160, when heat is applied to the thermal release tape at a temperature of approximately 200° C. for 10 to 60 seconds, an adhesive force of the thermal release tape is weakened, and thus, the thermal release tape may be removed from the specific FET 150. The method of removing the supporting member 160 may vary according to the material used to form the supporting member 160.

In the present exemplary embodiment, the transfer of a single specific semiconductor device is described. However, it is understood that one or more other exemplary embodiments are not limited thereto. For example, a plurality of semiconductor devices may be simultaneously transferred. That is, the transfer process may be performed at a wafer scale.

In FIG. 1E, the transfer process uses the supporting member 160. However, it is understood that one or more other exemplary embodiments are not limited thereto. For example, the transfer process may be performed by using a member (a pipe and a contact member) connected to a vacuum pump. When a vacuum pump is used for transferring, an attaching process and removing process of the supporting member 160 are omitted.

In the present exemplary embodiment, the amorphous graphene layer 130 is removed by using oxygen plasma processing in the transferring process of the specific semiconductor device. However, the amorphous graphene layer 130 may not be removed. For example, after forming the amorphous graphene layer 130, an insulating layer is formed on the amorphous graphene layer 130. Next, the ultra-thin silicon film 140 is formed on the insulating layer. Subsequent processes may be well understood from the exemplary embodiment described above. The insulating layer may be formed of silicon oxide or silicon nitride. The insulating layer prevents electrical connection between the amorphous silicon layer and the specific semiconductor device.

Figure 6:
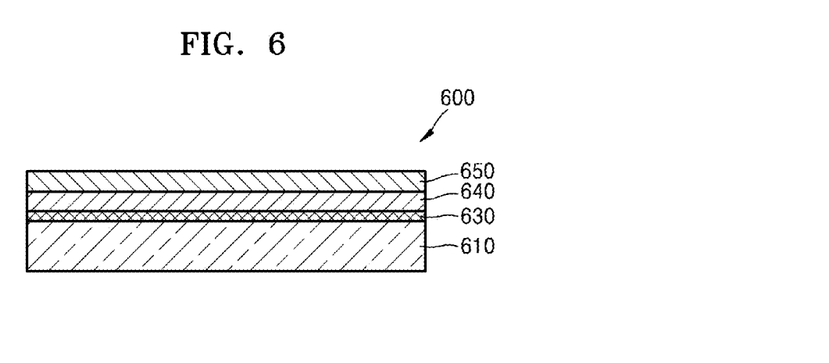
FIG. 6 is a cross-sectional view of a PN diode semiconductor device manufactured by using a method according to an exemplary embodiment.

FIG. 6 is a cross-sectional view of a PN diode semiconductor device 600 manufactured by using a method according to another exemplary embodiment.

Referring to FIG. 6, an amorphous graphene layer 630, a B-doped Si layer 640, and a P-doped-Si layer 650 are sequentially formed on a Ge substrate 610.

Figure 7:
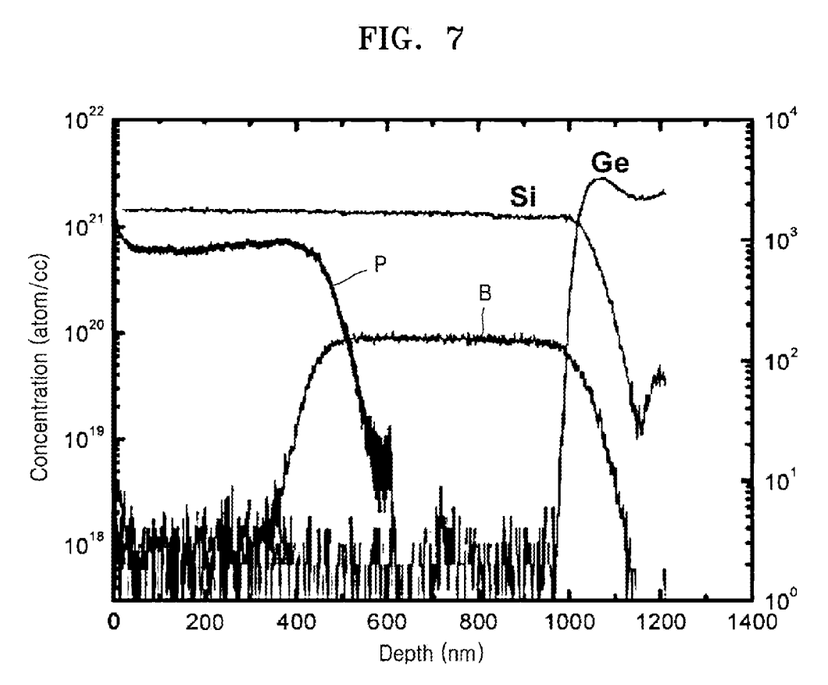
FIG. 7 is a graph of an analysis result of secondary ion mass spectrometry (SIMS) showing material distribution from an supper surface of the PN diode semiconductor device.

FIG. 7 is a graph of an analysis result of secondary ion mass spectrometry (SIMS) showing a material distribution from an upper surface of the PN diode semiconductor device 600.

Referring to FIG. 7, during forming an ultra-thin silicon film, the ultra-thin silicon film was doped with impurities. Accordingly, it is confirmed that the PN diode can be manufactured using the ultra-thin silicon film.

According to the exemplary embodiment, a flexible ultra-thin inorganic semiconductor film having a uniform thickness may be manufactured, and a semiconductor device that is formed by using the flexible ultra-thin inorganic semiconductor film has higher charge mobility and is resilient against an external environment (heat, oxygen, and moisture) when compared to a flexible device of the related art.

After transferring the semiconductor device that is formed by using the flexible ultra-thin inorganic semiconductor film on a flexible substrate, the flexible substrate may be applied to manufacture a wearable device, such as, an epidermal device.

In the exemplary embodiment described above, a method of manufacturing the ultra-thin silicon film is described. Hereinafter, a method of manufacturing an ultra-thin germanium film will be described with reference to FIGS. 1A through 1C. Like reference numerals are used to indicate elements that are equal or similar to each other.

The method of manufacturing the Ge layer 120 and the amorphous graphene layer 130 on the first substrate 110 is the same as the exemplary embodiment described above, and thus, the description thereof will be omitted here.

Referring to FIG. 1C, the ultra-thin germanium film 140 is formed on the amorphous graphene layer 130. The ultra-thin germanium film 140 may have a thickness of approximately 50 nm or less and be in a flexible state. Accordingly, the ultra-thin germanium film 140 may be used for manufacturing a flexible device that includes a wearable device, such as an epidermal device.

In order to form the ultra-thin germanium film 140, $GeH_4$ gas and a $H_2$ gas are supplied to a reaction chamber in a volume ratio of 1/20 under a process pressure of 10 Torr, and the reaction chamber is maintained at a temperature in a range from about 400° C. to about 600° C. The grown ultra-thin germanium film 140 may be an amorphous germanium film. The $GeH_4$ gas may be supplied as a mixed gas with the $H_2$ gas at a volume ratio of 5%.

The subsequent annealing process and a transferring process of a semiconductor device that is formed by using the ultra-thin germanium film 140 may be well understood from the exemplary embodiment described above, and thus, the description thereof will be omitted here.

Figure 8A:
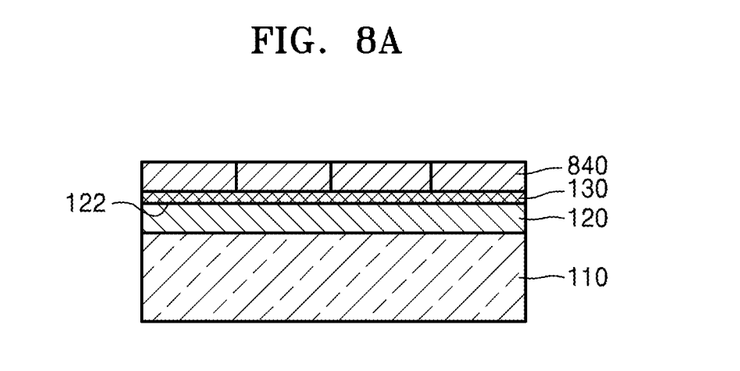
FIGS. 8A through 8C are cross-sectional views illustrating a method of manufacturing a three-dimensional (3D) semiconductor device by using an ultra-thin inorganic semiconductor film.
Figure 8B:
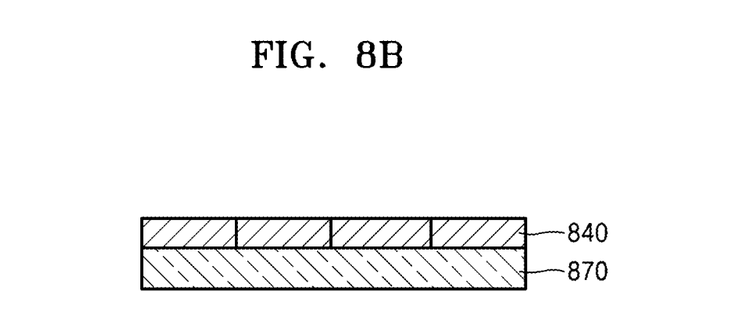
Figure 8C:
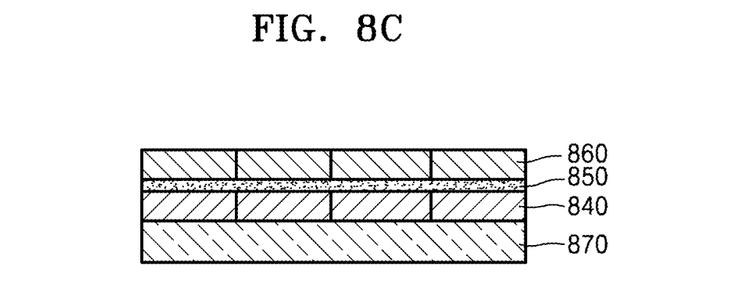

FIGS. 8A through 8C are cross-sectional views illustrating a method of manufacturing a three-dimensional (3D) semiconductor device by using an ultra-thin inorganic semiconductor film. The 3D semiconductor device may be a memory, a logic circuit, or a CMOS image sensor (CIS) sensor.

The Ge layer 120, the amorphous graphene layer 130, and the ultra-thin inorganic semiconductor film 140 are formed on the first substrate 110 using substantially the same manufacturing method as described with reference to FIGS. 1A through 1C.

Referring to FIG. 8A, a plurality of first semiconductor devices 840 are formed on the amorphous graphene layer 130 by using the ultra-thin inorganic semiconductor film 140. For example, a plurality of FETs, a plurality of photo diodes, or a plurality of PN diodes may be formed by using the ultra-thin inorganic semiconductor film 140.

Referring to FIG. 8B, a target substrate 870 is prepared. The target substrate 870 may be a flexible substrate or a hard substrate.

The plurality of second semiconductor devices 840 are transferred onto the target substrate 870 in a wafer scale. The transfer process may be performed by using a member (a pipe and a contact member) connected to a vacuum pump. The transfer process may be performed by using the supporting member described above. When the supporting member is used, a process for removing the supporting member is required.

Referring to FIG. 8C, a passivation layer 850 is formed on the first semiconductor devices 840. The passivation layer 850 may be an insulating layer.

Next, after manufacturing the ultra-thin inorganic semiconductor film 140 by using the method described with reference to FIGS. 1A through 1C, a plurality of second semiconductor devices 860 are formed on the amorphous graphene layer 130 by using the ultra-thin inorganic semiconductor film 140. For example, a plurality of FETs, a plurality of photo diodes, or a plurality of PN diodes may be formed by using the ultra-thin inorganic semiconductor film 140. The second semiconductor devices 860 may be the same as or different from the first semiconductor devices 840.

Next, the second semiconductor devices 860 are transferred onto the passivation layer 850 by attaching a supporting member on the second semiconductor devices 860 or by using a vacuum pump (not shown).

If the first semiconductor devices 840 are a plurality of readout integrated circuits (ROICs) and the second semiconductor devices 860 are a plurality of photo diodes, the manufactured stack device may be a back-illumination CMOS image sensor (CIS). In this case, the passivation layer 850 may be omitted.

However, it is understood that one or more other exemplary embodiments are not limited thereto. That is, a 3D device having more than three stack-layers may be manufactured by repeating the method of manufacturing the second semiconductor devices 860 and the transferring method. For example, a NAND memory device having a multi-layer structure may be manufactured.

According to the exemplary embodiment, the manufacture of a 3D chip having a stack structure is simplified. Since an ultra-thin semiconductor film is used, a thin 3D chip having a stack structure may be manufactured.

While one or more exemplary embodiments have been described with reference to the figures, it will be understood by those of ordinary skill in the art that various changes in form and details may be made therein without departing from the spirit and scope as defined by the following claims.

What is claimed is:

1. A method of manufacturing an ultra-thin inorganic semiconductor film, the method comprising:
   preparing a germanium (Ge) substrate:
   forming an amorphous graphene layer on the Ge substrate;
   forming an ultra-thin inorganic semiconductor film on the amorphous graphene layer; and
   transferring the ultra-thin inorganic semiconductor film to a target substrate.

2. The method of claim 1, wherein the preparing the Ge substrate comprises forming the Ge substrate on a first substrate, the first substrate comprising at least one from among Si, Ge, SiGe, GaAs, quartz, or alumina.

3. The method of claim 2, wherein the preparing the Ge substrate comprises epitaxially growing a Ge layer to a thickness in a range from about 50 nm to about 1 μm on the first substrate formed of at least one from among Si, SiGe and alloy $Si_xGe_{1-x}$.

4. The method of claim 1, wherein the amorphous graphene layer comprises a single layer of graphene.

5. The method of claim 4, wherein the forming the amorphous graphene layer comprises applying a carbon containing gas with hydrogen gas at which a volume ratio of the hydrogen gas is in a range from about 5 times to about 20 times of the carbon containing gas under a process pressure maintained in a range from about 1 Torr to about 10 Torr.

6. The method of claim 5, wherein the forming the amorphous graphene layer comprises maintaining a process temperature in a range from about 900° C. to about 930° C.

7. The method of claim 5, wherein the forming the amorphous graphene layer further comprises forming a passivation layer on a surface of the Ge substrate by applying hydrogen gas to the Ge substrate.

8. The method of claim 1, wherein the ultra-thin inorganic semiconductor film comprises at least one from among a Si thin film and a Ge thin film, the ultra-thin inorganic semiconductor film having a thickness of 50 μm or less.

9. The method of claim 1, wherein the forming the ultra-thin inorganic semiconductor film comprises applying a source gas for the ultra-thin inorganic semiconductor film and hydrogen gas.

10. The method of claim 1, further comprising forming a polycrystalline ultra-thin inorganic semiconductor film by annealing the ultra-thin inorganic semiconductor film.

11. The method of claim 1, further comprising forming an insulating layer on the Ge substrate prior to the forming of the amorphous graphene layer, and
wherein the forming of the amorphous graphene layer comprises forming the amorphous graphene layer on the insulating layer.

12. The method of claim 1, wherein the transferring the ultra-thin inorganic semiconductor film comprises transferring the ultra-thin inorganic semiconductor film to the target substrate by using a supporting member after attaching the supporting member to the ultra-thin inorganic semiconductor film or by using a vacuum produced by a vacuum pump.

13. The method of claim 1, further comprising removing the amorphous graphene layer by oxygen plasma processing prior to the transferring of the ultra-thin inorganic semiconductor film onto the target substrate.

14. The method of claim 1, wherein the forming the ultra-thin inorganic semiconductor film comprises forming at least one semiconductor device on the amorphous graphene layer by using the ultra-thin inorganic semiconductor film, and
wherein the transferring the ultra-thin inorganic semiconductor film onto the target substrate comprises transferring the at least one semiconductor device.

15. The method of claim 1, wherein the target substrate is a flexible substrate.

16. A method of manufacturing a three-dimensional (3D) semiconductor device, the method comprising:
preparing a germanium (Ge) substrate;
forming an amorphous graphene layer on the Ge substrate;
forming an ultra-thin inorganic semiconductor film on the amorphous graphene layer;
forming a plurality of first semiconductor devices by using the ultra-thin inorganic semiconductor film;
transferring the plurality of the first semiconductor devices to a target substrate;
forming a plurality of second semiconductor devices by repeating the preparing of the Ge substrate, the forming of the amorphous graphene layer on the Ge substrate, the forming of the ultra-thin inorganic semiconductor film on the amorphous graphene layer, and using the ultra-thin inorganic semiconductor film to form the plurality of second semiconductor devices; and
transferring the plurality of second semiconductor devices to the plurality of first semiconductor devices.

17. The method of claim 16, wherein the amorphous graphene layer comprises a single layer of graphene.

18. The method of claim 17, wherein the forming the amorphous graphene layer comprises applying a carbon containing gas with hydrogen gas at which a volume ratio of the hydrogen gas is in a range from about 5 times to about 20 times of the carbon containing gas under a process pressure maintained in a range from about 1 Torr to about 10 Torr.

19. The method of claim 16, wherein the forming the amorphous graphene layer further comprises forming a passivation layer on a surface of the Ge substrate by applying hydrogen gas onto the Ge substrate.

20. The method of claim 16, wherein the ultra-thin inorganic semiconductor film comprises at least one from among a Si thin film and a Ge thin film, the ultra-thin inorganic semiconductor film having a thickness of 50 μm or less.

21. The method of claim 16, further comprising:
forming a plurality of third semiconductor devices by repeating the preparing of the Ge substrate, the forming of the amorphous graphene layer on the Ge substrate, the forming of the ultra-thin inorganic semiconductor film on the amorphous graphene layer, and using the ultra-thin inorganic semiconductor film to form the plurality of third semiconductor devices; and
transferring the plurality of third semiconductor devices to the plurality of second semiconductor devices.

\* \* \* \* \*